United States Patent
Masuda et al.

(10) Patent No.: US 11,098,405 B2
(45) Date of Patent: Aug. 24, 2021

(54) FILM FORMING APPARATUS AND FILM FORMING METHOD

(71) Applicant: TOSHIBA MEMORY CORPORATION, Tokyo (JP)

(72) Inventors: Hideaki Masuda, Nagoya Aichi (JP); Nobuhide Yamada, Yokohama Kanagawa (JP); Rikyu Ikariyama, Chigasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 479 days.

(21) Appl. No.: 15/902,698

(22) Filed: Feb. 22, 2018

(65) Prior Publication Data
US 2019/0085453 A1   Mar. 21, 2019

(30) Foreign Application Priority Data
Sep. 19, 2017   (JP) .............................. JP2017-178727

(51) Int. Cl.
*C23C 16/455* (2006.01)
*H01J 37/32* (2006.01)
*C23C 16/44* (2006.01)

(52) U.S. Cl.
CPC .... *C23C 16/45565* (2013.01); *C23C 16/4401* (2013.01); *C23C 16/4408* (2013.01); *C23C 16/4409* (2013.01); *C23C 16/45523* (2013.01); *C23C 16/45589* (2013.01); *H01J 37/3244* (2013.01)

(58) Field of Classification Search
CPC ......... C23C 16/45565; C23C 16/45589; H01J 37/3244; C32C 16/4408
See application file for complete search history.

(56) References Cited

U.S. PATENT DOCUMENTS

| | | | |
|---|---|---|---|
| 5,567,243 A * | 10/1996 | Foster | C23C 16/04 118/730 |
| 7,267,725 B2 | 9/2007 | Kawano | |
| 9,490,149 B2 | 11/2016 | Chandrasekharan et al. | |
| 2009/0325386 A1 * | 12/2009 | Devine | C23C 16/45557 438/706 |
| 2012/0160173 A1 * | 6/2012 | Endo | C23C 16/4412 118/728 |
| 2015/0315706 A1 | 11/2015 | Chandrasekharan et al. | |
| 2016/0097120 A1 * | 4/2016 | Shugrue | B01D 53/0446 137/1 |

\* cited by examiner

*Primary Examiner* — Elizabeth A Burkhart
(74) *Attorney, Agent, or Firm* — Foley & Lardner LLP (57) ABSTRACT

A shower head includes a face plate having an outer peripheral portion and a plurality of gas injection holes disposed inside the outer peripheral portion, a movable portion facing the face plate and having a gas introduction passage, and a seal interposed between the outer peripheral portion of the face plate and the movable portion. The movable portion is arranged to move, in the first direction, between a first position in which the movable portion is coupled to the face plate by interposing the seal between the movable portion and the face plate, and the gas introduction passage communicates with the inside of the chamber via the gas injection holes, and a second position in which the movable portion is separated from the face plate, and the gas introduction passage communicates with the inside of the chamber via a gap between the movable portion and the face plate.

15 Claims, 5 Drawing Sheets

FILM FORMING APPARATUS AND FILM FORMING METHOD

CROSS-REFERENCE TO RELATED APPLICATION

This application claims the benefit of and priority to Japanese Patent Application No. 2017-178727, filed Sep. 19, 2017, the entire contents of which are incorporated herein by reference.

FIELD

Embodiments described herein relate generally to a film forming apparatus and a film forming method.

BACKGROUND

In a plasma chemical vapor deposition (CVD) or the like, when a process gas (film forming gas) is switched, a purge process for removing residual gas phase reactant from an inside of a shower head and an inside of a chamber is performed.

DETAILED DESCRIPTION

According to some embodiments a film forming apparatus and a film forming method capable of shortening gas switching time is provided.

According to some embodiments, a film forming apparatus includes a chamber, a pedestal disposed in the chamber, and a shower head spaced apart from the pedestal in a first direction and facing the pedestal. The shower head includes a face plate having an outer peripheral portion and a plurality of gas injection holes disposed inside the outer peripheral portion, a movable portion facing the face plate and having a gas introduction passage, and an O-ring interposed between the outer peripheral portion of the face plate and the movable portion. The movable portion moves, in the first direction, between a first position, at which the movable portion is coupled to the face plate by interposing the O-ring between the movable portion and the face plate and the gas introduction passage communicates with the inside of the chamber via the gas injection holes, and a second position, at which the movable portion is separated from the face plate and the gas introduction passage communicates with the inside of the chamber via a gap between the movable portion and the face plate.

Hereinafter, embodiments will be described with reference to the drawings. In the drawings, the same elements are assigned the same reference numerals.

Figure 1:
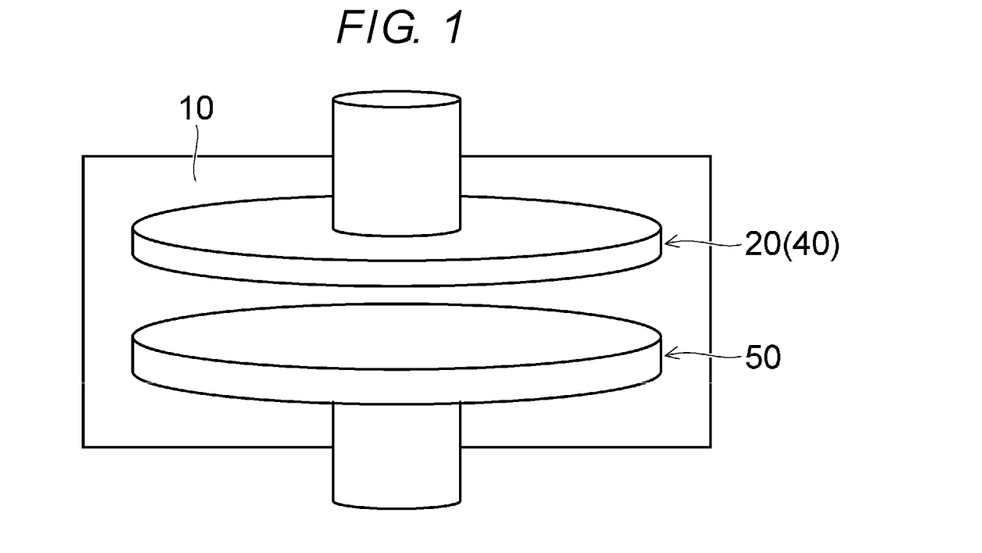
FIG. 1 is a schematic diagram of a film forming apparatus according to some embodiments.

FIG. 1 is a schematic diagram of a film forming apparatus according to some embodiments.

The film forming apparatus of some embodiments may be, for example, a plasma CVD apparatus and includes a shower head 20 which functions as an upper electrode and a pedestal 50 which functions as a lower electrode.

The pedestal 50 is disposed in a chamber 10, and the shower head 20 is spaced apart from the pedestal 50 in a first direction and faces the pedestal 50. The first direction may be, for example, a vertical direction (or up-and-down direction).

The pedestal 50 may have a built-in heater. On the pedestal 50, for example, a semiconductor wafer may be supported as a film formation target.

The shower head 20 is disposed above the pedestal 50 and at least a face plate of the shower head 20 to be described later is disposed in the chamber 10.

The inside of the chamber 10 is brought to a predetermined reduced-pressure atmosphere by an exhaust system (not illustrated) connected to the chamber 10. Power (for example, high-frequency power) is applied between the shower head 20 and the pedestal 50 in a state where the process gas (film forming gas) is introduced into the chamber 10 through the shower head 20, and plasma is generated between the shower head 20 and the pedestal 50. Under the plasma atmosphere, a film containing an element contained in the film forming gas is formed on the wafer.

Figure 2A:
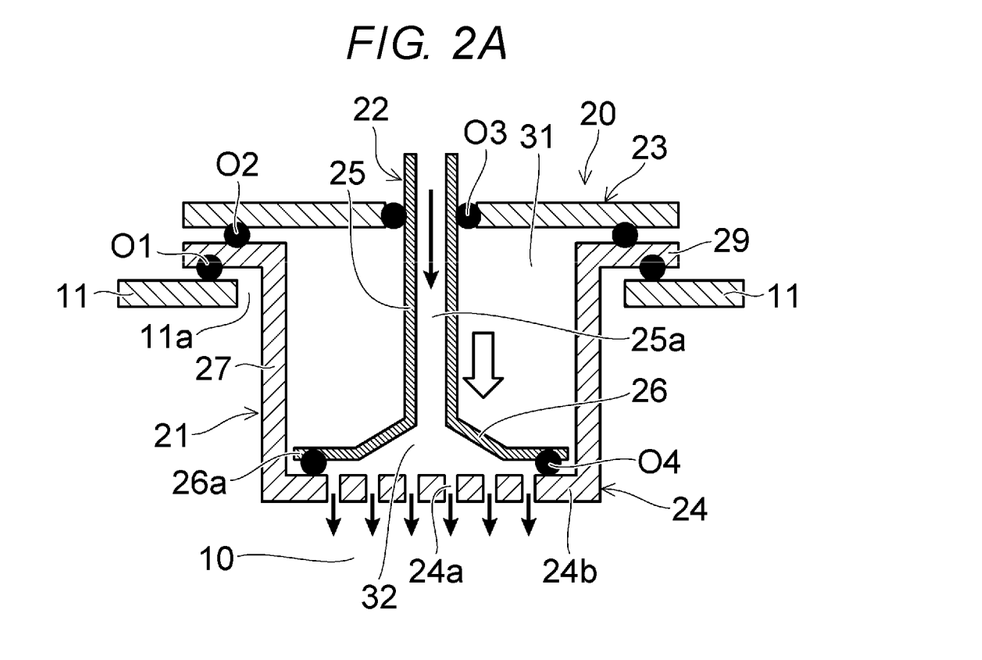
FIGS. 2A and 2B are schematic cross-sectional views of a shower head according to some embodiments.
Figure 2B:
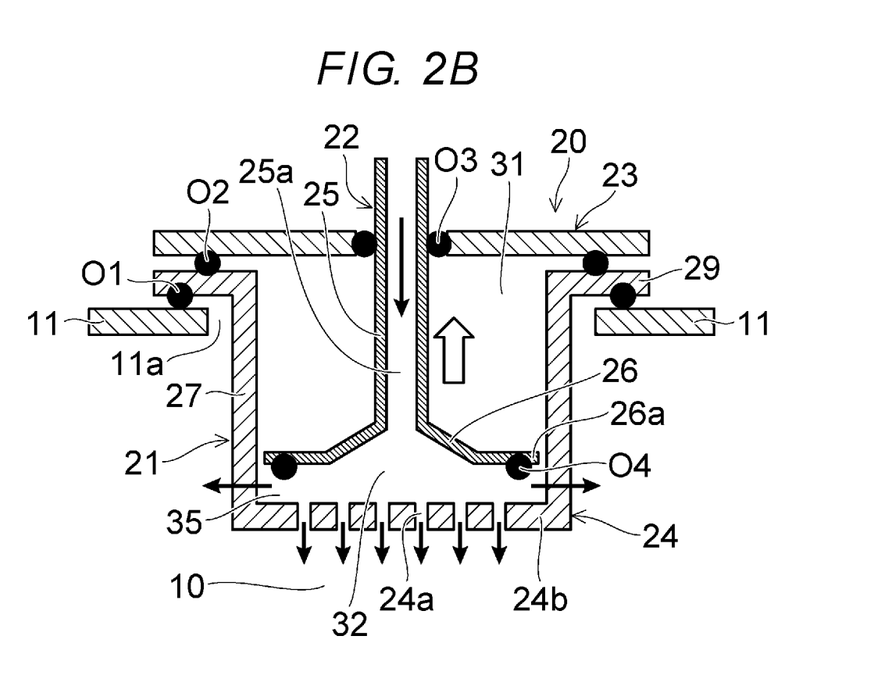

FIGS. 2A and 2B are schematic cross-sectional views of the shower head 20 of some embodiments.

As will be described later, the shower head 20 includes a movable portion 22 that moves between a first position illustrated in FIG. 2A and a second position illustrated in FIG. 2B in a first direction (up-and-down direction).

Figure 3:
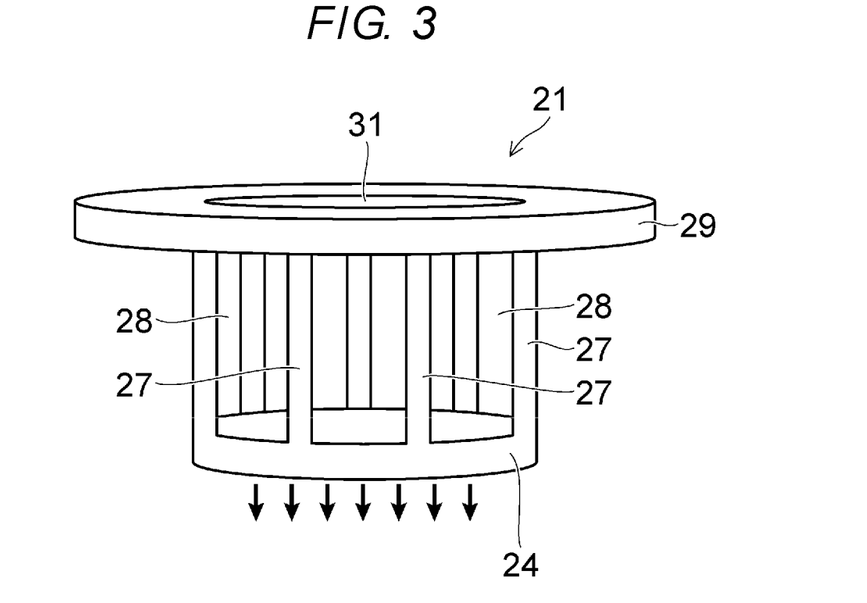
FIG. 3 is a schematic perspective view of a fixed portion of the shower head illustrated in FIGS. 2A and 2B.

FIG. 3 is a schematic perspective view of a fixed portion 21 of the shower head 20.

The shower head 20 has a fixed portion (outer piece) 21 and the movable portion (inner piece) 22.

The fixed portion 21 has a flange portion 29, a side wall portion 27, and a face plate 24. The fixed portion 21 is fixed to a chamber wall.

The flange portion 29 is disposed on a chamber lid (or upper wall) 11. An O-ring (gasket) O1 is interposed between the flange portion 29 and the chamber lid 11 and communication between inside and outside of the chamber 10 through a gap between the flange portion 29 and the chamber lid 11 is blocked.

An opening 11a is formed in the chamber lid 11 and the side wall portion 27 extends from the flange portion 29 into the chamber 10 which is below the side wall portion through the opening 11a. The face plate 24 is provided at the lower end of the side wall portion 27.

As illustrated in FIG. 3, a plurality of columnar side wall portions 27 connect the flange portion 29 and the face plate 24 to each other, and the face plate 24 is supported onto the chamber lid 11 by the plurality of side wall portions 27 and the flange portion 29.

The plurality of side wall portions 27 are disposed to be spaced apart from each other along a circumferential direction of the ring-shaped flange portion 29, and slits 28 are formed between adjacent side wall portions 27.

The face plate 24 may be formed in a disk shape and have an outer peripheral portion 24b and a plurality of gas injection holes 24a disposed inside (radially within) the outer peripheral portion 24b. The face plate 24 faces the pedestal 50 as illustrated in FIG. 1 in the chamber 10. The plurality of gas injection holes 24a penetrates through the face plate 24 and outlets of the gas injection holes 24a communicate with space above the pedestal 50 in the chamber 10.

A plurality of slits 28 illustrated in FIG. 3 are located outside a region where the plurality of gas injection holes 24a in the face plate 24 are disposed.

The movable portion 22 is disposed inside the fixed portion 21 so as to be movable up and down. Space inside the fixed portion 21 is closed by the lid 23.

An outer peripheral portion of a lid 23 is disposed above the flange portion 29 of the fixed portion 21. An O-ring O2 is interposed between an outer peripheral portion of the lid 23 and the flange portion 29 of the fixed portion 21.

The movable portion 22 has a stem 25 extending in the up-and-down direction and a back plate 26 provided on the lower end of the stem 25. The stem 25 is disposed at the center of a circular back plate 26 when viewed from the top.

A gas introduction passage 25a is formed in the stem 25 and the gas introduction passage 25a is connected to a gas supply source through a pipe (not illustrated).

The stem 25 penetrates through an opening formed at the center of the lid 23. An O-ring O3 is interposed between the side surface of the stem 25 and the lid 23.

Communication between space inside the fixed portion 21 and space outside the shower head 20 are blocked by the O-ring O2 and the O-ring O3.

The O-ring O3 is attached to the lid 23, and the stem 25 can move up and down in a state where the side surface of the stem 25 is in an airtight contact with the O-ring O3. The O-ring O3 regulates a lateral displacement of the stem 25 and guides the up and down movement of the stem 25.

The back plate 26 faces the upper surface (back surface) of the face plate 24 within the space inside the fixed portion 21.

As illustrated in FIG. 2A, at the time of film formation, an O-ring O4 is interposed between an outer peripheral portion 24b of the face plate 24 and an outer peripheral portion 26a of the back plate 26 and the back plate 26 is coupled to the face plate 24.

In this state, space (plenum space) 32 between the back plate 26 and the face plate 24 is blocked from the slits 28 illustrated in FIG. 3 by the O-ring O4. A gas introduction passage 25a communicates with the space 32 of which an end in the circumferential direction is closed by the O-ring O4. Furthermore, the space 32 communicates with the plurality of gas injection holes 24a. Accordingly, the gas introduction passage 25a is not connected to the slit 28 formed in the side wall of the fixed portion 21, and communicates with the chamber 10 through only the space 32 between the back plate 26 and the face plate 24 and the plurality of gas injection holes 24a.

The movable portion 22 is moved up and down by a mechanism having, for example, an electric motor (not illustrated) as a source of power.

As illustrated in FIG. 2A, the movable portion 22 at the first position is coupled to the face plate 24 by interposing the O-ring O4 between the back plate 26 and the face plate 24.

The movable portion 22 is moved to a second position illustrated in FIG. 2B by moving the movable portion 22 upward from the first position. At the second position, the back plate 26 of the movable portion 22 is separated from the face plate 24 and a gap 35 is formed between the outer peripheral portion 26a of the back plate 26 and the outer peripheral portion 24b of the face plate 24. The gap 35 communicates with the inside of the chamber 10 via the slits 28 illustrated in FIG. 3. At the second position, the gas introduction passage 25a communicates with the inside of the chamber 10 with the gas injection holes 24a, the gaps 35, and the slits 28.

The conductance of a gas flow path leading from the gas introduction passage 25a to the inside of the chamber 10 through the gap 35 and the slits 28 is greater than the conductance of a gas flow path leading from the gas introduction passage 25a to the inside of the chamber 10 through the plurality of gas injection holes 24a.

For example, a height of the gap 35 is greater than a diameter of each of the gas injection holes 24a. The total cross sectional area along the circumferential direction of the gap 35 and the total cross sectional area of the plurality of slits 28 are greater than the total cross sectional area of the plurality of gas injection holes 24a.

Next, a film forming method using a film forming apparatus having the shower head 20 illustrated in FIGS. 2A and 2B will be described.

Figure 5:
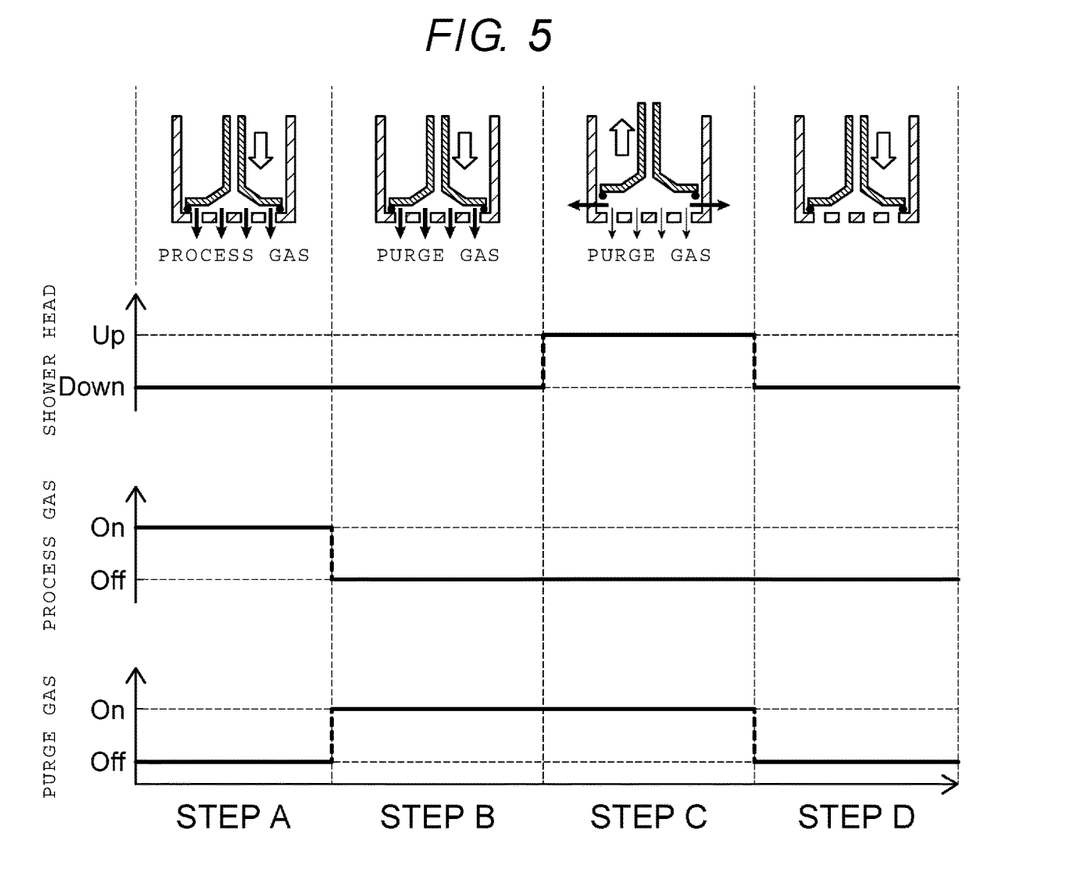
FIG. 5 is a timing chart of a film forming method of some embodiments.

FIG. 5 is a timing chart of the film forming method.

In FIG. 5, the designation "Up" of the shower head illustrates a state illustrated in FIG. 2B in which the back plate 26 and the face plate 24 are separated from each other in the up-and-down direction, while the designation "Down" illustrates a state illustrated in FIG. 2A where the back plate 26 and the faceplate 24 are coupled to each other via the O-ring O4.

The designation "On" of the process gas represents supply of the process gas to the gas introduction passage 25a and "Off" represents stoppage of supply of the process gas to the gas introduction passage 25a.

Similarly, "On" of the purge gas represents supply of the purge gas to the gas introduction passage 25a and "Off" represents stoppage of supply of the purge gas to the gas introduction passage 25a.

In the state illustrated in FIG. 2A, a first process gas (first film forming gas) is supplied to the gas introduction passage 25a and a first film is formed on a wafer on the pedestal 50 (step A). That is, a portion between the outer peripheral portion 26a of the back plate 26 and the outer peripheral portion 24b of the face plate 24 is airtight closed by the O-ring O4 and gas introduced into the gas introduction passage 25a is supplied into the chamber 10 of the wafer only through the plurality of gas injection holes 24a.

When film formation of the first film is ended, the gas supplied to the gas introduction passage 25a is switched from the film forming gas to a purge gas (for example, an inert gas) while being kept in the state illustrated in FIG. 2A (step B). The purge gas introduced into the gas introduction passage 25a is supplied into the chamber 10 only through the plurality of gas injection holes 24a.

Thereafter, the movable portion 22 is pulled upward to separate the back plate 26 from the face plate 24 as illustrated in FIG. 2B. The gap 35 is formed between the outer peripheral portion 26a of the back plate 26 and the outer peripheral portion 24b of the face plate 24. The purge gas supplied to the gas introduction passage 25a flows into the chamber 10 through the gap 35 and the slits 28 on the side wall of the fixed portion 21 illustrated in FIG. 3 (step C).

In this case, the purge gas also flows into the chamber 10 from the gas introduction passage 25a through the gas injection holes 24a of the face plate 24. As described above, the conductance of gas flow through the gap 35 and the slits 28 is greater than the conductance of gas flow through the gas injection holes 24a and thus, most of the purge gas flows into the chamber 10 through the gap 35 and the slits 28.

By the purge process illustrated in Step B and Step C, residual gas phase reactant used in forming the first film is removed from the inside of the shower head 20 and also, the residual gas phase reactant is exhausted from the inside of the chamber 10.

After the purge process, as illustrated in FIG. 2A, the movable portion 22 is pushed down to be ready for the next film forming process (step D). Then, the film formation process returns to step A again and forming of a second film is performed by using a second process gas (second film forming gas) different from the first process gas. Thereafter, step B and subsequent steps are repeated.

In the purge process (steps B and C) and the preparation state (step D), voltage application is stopped and plasma is not generated in the chamber 10.

In plenum space between the back plate and the face plate in a general shower head, gas is easily retained in an outer peripheral region (region without gas injection holes immediately therebelow) of a region where the gas injection holes are formed, which hinders shortening of gas replacement time (purge time).

In contrast, according to the embodiment, at the time of the purge process, as illustrated in FIG. 2B, the outer peripheral portion 26a of the back plate 26 and the outer peripheral portion 24b of the face plate 24 are vertically spaced and the gap 35 is formed on the outer peripheral side of the region where the plurality of gas injection holes 24a are disposed. Then, the purge gas is caused to flow into the chamber 10 through the gap 35.

According to the embodiment, the residual gas in the shower head can be rapidly scavenged (purged) from the inside of the shower head without causing gas retention in the outer peripheral region of the plenum space 32 (region without the gas injection holes 24a immediately therebelow). This can shorten the gas switching time and also prevent contamination of the film formation target due to the residual gas.

Figure 6:
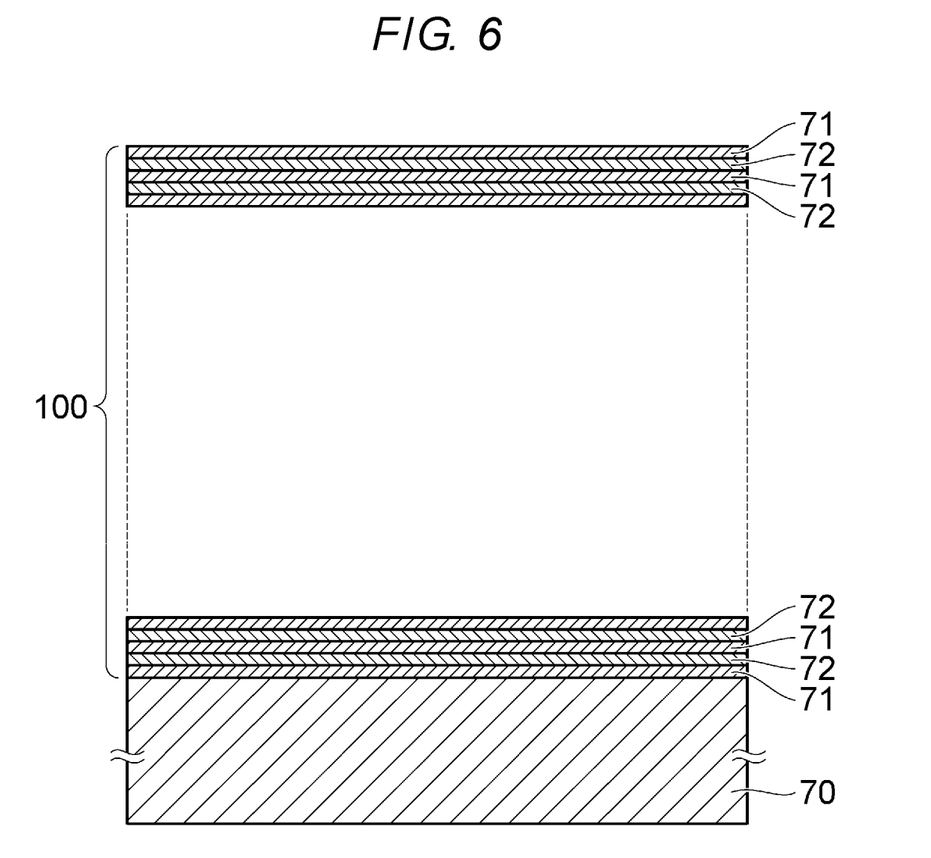
FIG. 6 is a schematic cross-sectional view of an example of a film formation target.

FIG. 6 is a schematic cross-sectional view of an example of a film formation target.

On a substrate 70, a first film 71 and a second film 72, different from the first film 71, are alternately formed. The film formation of the first film 71 and the film formation of the second film 72 are alternately repeated to form a stacked body 100 including the plurality of first films 71 and the plurality of second films 72 on the substrate 70.

In step A in FIG. 5, a silicon oxide film is formed as the first film 71 by using, for example, the first process gas containing oxygen and silicon (film forming gas). Thereafter, the purge process using the purge gas is performed in steps B and C and preparation for the next film formation of the second film 72 is made in step D.

Then, again in step A, a silicon nitride film is formed as the second film 72 by using, for example, the second process gas (film forming gas) containing nitrogen and silicon. Thereafter, the purge process using the purge gas is performed in steps B and C and preparation for the next film formation of the first film 71 is made in step D.

Such film formation of the first film 71, the purge process, film formation of the second film 72, the purge process, film formation of the first film 71 are repeated to form the stacked body 100 including the plurality of first films 71 and the plurality of second films 72 on the substrate 70.

Figure 4A:
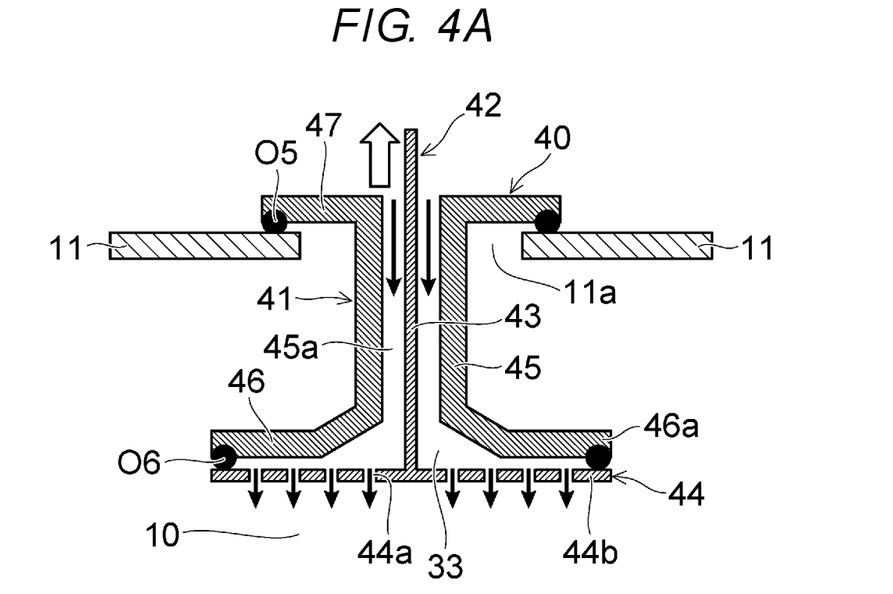
FIGS. 4A and 4B are schematic cross-sectional views of a shower head according to some embodiments.
Figure 4B:
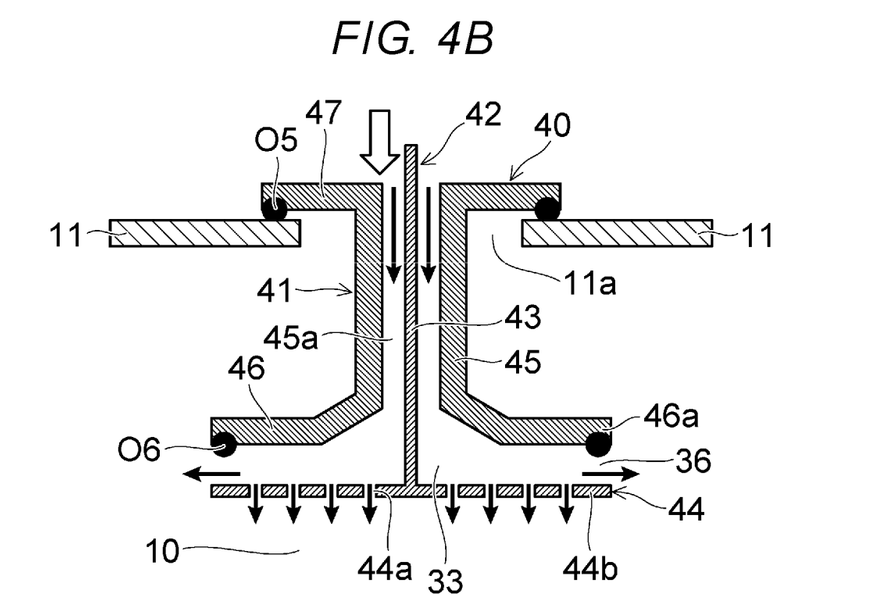

FIGS. 4A and 4B are schematic cross-sectional views of a shower head 40 according to some other embodiments. The shower head 40 also has a movable portion 42 which moves between a first position illustrated in FIG. 4A and a second position illustrated in FIG. 4B in the up-and-down direction.

The shower head 40 is disposed above the pedestal 50 illustrated in FIG. 1 and at least a face plate of the shower head 40 to be described later is disposed in the chamber 10.

The shower head 40 has a fixed portion 41 fixed to the chamber wall and a movable portion 42.

The fixed portion 41 includes a flange portion 47, a stem 45, and a back plate 46.

The flange portion 47 is disposed above the chamber lid 11. An O-ring (gasket) O5 is interposed between the flange portion 47 and the chamber lid 11 and communication between the inside and outside of the chamber 10 through a gap between the flange portion 47 and the chamber lid 11 is blocked.

The opening 11a is formed in the chamber lid 11 and the stem 45 extends from the flange portion 47 into the lower chamber 10 through the opening 11a. A back plate 46 is provided at the lower end of the stem 45. The stem 45 is disposed at the center of a circular back plate 46 when viewed from the top.

A gas introduction passage 45a is formed in the stem 45 and the gas introduction passage 45a is connected to a gas supply source through a pipe (not illustrated).

The movable portion 42 has a rod 43 and a faceplate 44. The lower end of the rod 43 is coupled to the center of the face plate 44, which has a circular shape when viewed from the top. The rod 43 is disposed so as to be vertically movable in the gas introduction passage 45a of the inside of the stem 45.

The face plate 44 is formed in a disk shape and has an outer peripheral portion 44b and a plurality of gas injection holes 44a disposed inside the outer peripheral portion 44b. The face plate 44 faces the pedestal 50 illustrated in FIG. 1 in the chamber 10. The plurality of gas injection holes 44a penetrates through the face plate 44 and the outlet of the gas injection holes 44a communicates with space above the pedestal 50 in the chamber 10.

The back plate 46 faces the upper surface (back surface) of the face plate 44. As illustrated in FIG. 4A, at the time of film formation, an O-ring O6 is interposed between the outer peripheral portion 44b of the face plate 44 and an outer peripheral portion 46a of the back plate 46 and the back plate 46 is coupled to the face plate 44.

In this state, a circumferential end of the space (plenum space) 33 between the back plate 46 and the face plate 44 is airtight closed by the O-ring O6. The space 33 communicates with the gas introduction passage 45a and the plurality of gas injection holes 44a. In the state illustrated in FIG. 4A, the gas introduction passage 45a communicates with the inside of the chamber 10 through only the plurality of gas injection holes 44a.

The rod 43 is moved up and down by a mechanism having, for example, an electric motor (not illustrated) as a source of power. By lowering the rod 43, the face plate 44 moves from the first position illustrated in FIG. 4A to the second position illustrated in FIG. 4B.

At the second position, the face plate 44 is separated from the back plate 46 and a gap 36 is formed between the outer peripheral portion 46a of the back plate 46 and the outer peripheral portion 44b of the face plate 44. At the second position, the gas introduction passage 45a communicates with the inside of the chamber 10 not only through the gas injection holes 44a but also through the gap 36.

The conductance of the gas flow path leading from the gas introduction passage 45a to the inside of the chamber 10 via the gap 36 is greater than the conductance of the gas flow path leading from the gas introduction passage 45*a* to the inside of the chamber 10 via the plurality of gas injection holes 44*a*.

For example, a height of the gap 36 is greater than a diameter of each of the gas injection holes 44*a*. The total cross-sectional area along the circumferential direction of the gap 36 is greater than the total cross-sectional area of the plurality of gas injection holes 44*a*.

Next, a film forming method using a film forming apparatus having a shower head 40 illustrated in FIGS. 4A and 4B will be described.

In the state illustrated in FIG. 4A, a first process gas (first film forming gas) is supplied to the gas introduction passage 45*a* and a first film is formed on a wafer on the pedestal 50. That is, space between the outer peripheral portion 46*a* of the back plate 46 and the outer peripheral portion 44*b* of the face plate 44 is air-tightly closed by the O-ring O6 and gas introduced into the gas introduction passage 45*a* is supplied to the wafer within the chamber 10 only through the plurality of gas injection holes 44*a*.

When film formation of the first film is ended, the gas supplied to the gas introduction passage 45*a* is switched from the film forming gas to a purge gas (for example, an inert gas) while being kept in the state illustrated in FIG. 4A (corresponding to step B) in FIG. 5. The purge gas introduced into the gas introduction passage 45*a* is supplied into the chamber 10 only through the plurality of gas injection holes 44*a*.

Thereafter, the movable portion 42 is lowered downward to separate the face plate 44 from the back plate 46 as illustrated in FIG. 4B. The gap 36 is formed between the outer peripheral portion 46*a* of the back plate 46 and the outer peripheral portion 44*b* of the face plate 44. The purge gas supplied to the gas introduction passage 45*a* flows into the chamber 10 through the gap 36 (corresponding to step C in FIG. 5).

In this case, the purge gas flows into the chamber 10 from the gas introduction passage 45*a* through the gas injection holes 44*a* of the face plate 44. As described above, the conductance of the gas flow through the gap 36 is greater than the conductance of the gas flow through the gas injection holes 44*a* and thus, most of the purge gas flows through the gap 36 into the chamber 10.

In the purge process described above, residual gas phase reactant used in forming the first film is removed from the inside of the shower head 40 and also, the residual gas phase reactant is exhausted from the inside of the chamber 10.

After the purge process, as illustrated in FIG. 4A, the movable portion 42 is pulled up to be ready for the next film forming process (corresponding to step D in FIG. 5). Then, a second film is formed using a second process gas (second film forming gas) different from the first process gas. Thereafter, step B and subsequent steps are repeated.

Also, in the embodiment illustrated in FIGS. 4A and 4B, at the time of the purge process, the outer peripheral portion 46*a* of the back plate 46 and the outer peripheral portion 44*b* of the face plate 44 are vertically spaced from each other as illustrated in FIG. 4B and the gap 36 is formed on the outer peripheral side of a region where the plurality of gas injection holes 44*a* are disposed. Then, the purge gas is caused to flow into the chamber 10 through the gap 36.

According to such an embodiment, the residual gas in the shower head can be rapidly scavenged (purged) from the inside of the shower head without causing gas retention in the outer peripheral region of the plenum space 33 (region without the gas injection holes 44*a* immediately therebelow). This can shorten the gas switching time and also prevent contamination of the film formation target due to the residual gas.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A film forming apparatus comprising:
a chamber;
a pedestal disposed in the chamber; and
a shower head spaced from the pedestal in a first direction and facing the pedestal, wherein the shower head comprises:
a face plate having an outer peripheral portion and a plurality of gas injection holes disposed radially within the outer peripheral portion,
a movable passage portion facing the face plate and having a gas introduction passage,
a first seal interposed between the outer peripheral portion of the face plate and the movable passage portion, and
a side wall portion that fixes the face plate onto a chamber wall, and
one or more slits formed in the side wall portion,
wherein the side wall portion and the face plate are fixed to the chamber,
wherein the movable passage portion is arranged to move, in the first direction, between
a first position in which the movable passage portion is coupled to the face plate via the first seal, and the gas introduction passage communicates with the chamber via the gas injection holes, and
a second position in which the movable passage portion is separated from the face plate, and the gas introduction passage communicates with the chamber via a gap between the movable passage portion and the face plate.

2. The film forming apparatus according to claim 1, wherein, in the second position, the gas introduction passage communicates with the chamber via the gap between the movable passage portion and the face plate and via the gas injection holes.

3. The film forming apparatus according to claim 2, wherein, in the first position, the gas introduction passage communicates with the chamber only via the gas injection holes.

4. The film forming apparatus according to claim 1, wherein the one or more slits communicate with the gap and the chamber.

5. The film forming apparatus according to claim 4, wherein, in the second position, the conductance of gas flow with the chamber via the gap and the one or more slits is greater than a conductance of gas flow with the chamber via the gas injection holes.

6. The film forming apparatus according to claim 4, wherein a total cross sectional area along a circumferential direction of the gap and a total cross sectional area of the one or more slits are greater than a total cross sectional area of the gas injection holes.

7. The film forming apparatus according to claim 1, wherein the first seal includes an o-ring.

8. The film forming apparatus according to claim 1, wherein a height of the gap is greater than a diameter of each of the gas injection holes.

9. A film forming apparatus comprising:
a chamber;
a pedestal disposed in the chamber; and
a shower head spaced apart from the pedestal in a first direction and facing the pedestal, wherein the shower head comprises:
  a face plate having an outer peripheral portion and a plurality of gas injection holes disposed radially within the outer peripheral portion,
  a fixed portion comprising a back plate, a stem and a flange portion, wherein the back plate facing faces the face plate, the stem is columnar, a gas introduction passage is formed inside with one end of the stem connected to the back plate and the other end connected to the flange portion, and the flange portion is fixed to the chamber,
  a rod, a first end of the rod fixed at a substantially center of the face plate, and the rod being provided in a gas introduction path passage, and
  a seal interposed between the outer peripheral portion of the face plate and the back plate, and
wherein the face plate is arranged to move, in the first direction, between
  a first position in which the face plate is coupled to the back plate via the seal interposed between the face plate and the back plate, and the gas introduction passage communicates with the inside of the chamber via the gas injection holes, and
  a second position in which the face plate is separated from the fixed portion and the gas introduction passage communicates with the inside of the chamber via a gap between the face plate and the back plate.

10. The film forming apparatus according to claim 9, wherein the seal includes an o-ring.

11. The film forming apparatus according to claim 9, wherein in the second position, the gas introduction passage communicates with the inside of the chamber via the gap between the movable portion and the face plate and via the gas injection holes.

12. The film forming apparatus according to claim 11, wherein in the first position, the gas introduction passage communicates with an inside of the chamber only via the gas injection holes.

13. The film forming apparatus according to claim 9, wherein in the second position, the conductance of gas flow with the inside of the chamber via the gap is greater than a conductance of gas flow with the inside of the chamber via the gas injection holes.

14. The film forming apparatus according to claim 9, wherein a total cross sectional area along a circumferential direction of the gap is greater than a total cross sectional area of the gas injection holes.

15. The film forming apparatus according to claim 9, wherein a height of the gap is greater than a diameter of each of the gas injection holes.

* * * * *